United States Patent
Ono et al.

(10) Patent No.: US 6,331,118 B1
(45) Date of Patent: Dec. 18, 2001

(54) ELECTRODE SPACING CONVERSION ADAPTOR

(75) Inventors: Hiroaki Ono; Masanori Hirano, both of Kanazawa (JP)

(73) Assignee: Kabushiki Kaisha Linear Circuit, Kanazawa (JP)

(*) Notice: Subject to any disclaimer, the term of this patent is extended or adjusted under 35 U.S.C. 154(b) by 0 days.

(21) Appl. No.: 09/334,727

(22) Filed: Jun. 17, 1999

(30) Foreign Application Priority Data

Jun. 19, 1998 (JP) .................................................. 10-173058

(51) Int. Cl.[7] ....................................................... H01R 4/58
(52) U.S. Cl. ............................ 439/91; 174/251; 174/261; 361/767; 361/792
(58) Field of Search ..................................... 174/251, 261, 174/264, 265; 361/767, 768, 777, 792, 794, 795; 439/91

(56) References Cited

U.S. PATENT DOCUMENTS

| | | |
|---|---|---|
| 4,295,700 | 10/1981 | Sado . |
| 4,408,814 * | 10/1983 | Takashi et al. ..................... 339/59 |
| 4,643,498 * | 2/1987 | Taniguchi ..................... 339/17 M |
| 4,871,316 * | 10/1989 | Herrell ..................... 439/66 |
| 4,939,452 * | 7/1990 | Reinholz ..................... 324/158 |
| 5,096,426 * | 3/1992 | Simpson et al. ..................... 439/66 |
| 5,399,982 | 3/1995 | Driller et al. . |
| 5,785,538 * | 7/1998 | Beaman et al. ..................... 439/91 |
| 5,805,425 * | 9/1998 | Peterson ..................... 361/769 |
| 5,844,783 * | 12/1998 | Kojima ..................... 361/777 |
| 5,951,304 * | 9/1999 | Wildes et al. ..................... 439/67 |

FOREIGN PATENT DOCUMENTS

| | | |
|---|---|---|
| 2276502 | 9/1994 | (GB) . |
| 56-148071 | 11/1981 | (JP) . |

\* cited by examiner

*Primary Examiner*—Jeffrey Gaffin
*Assistant Examiner*—Jose' H. Alcala
(74) *Attorney, Agent, or Firm*—Smith Patent Office

(57) ABSTRACT

An electrode spacing conversion adaptor is formed of a plurality of sheet elements having top and bottom electrodes arrayed at different intervals along upper and lower ends of each sheet element, respectively, wherein the top electrodes are individually connected to their corresponding bottom electrodes by intermediate conductors. The individual sheet elements are angled such that the upper portions of the sheet elements carrying the top electrodes are stacked at intervals different from intervals at which the lower portions carrying the bottom electrodes are stacked. The individual sheet elements may be stacked to form laminated pieces in such a way that the bottom electrodes are concentrated in a small area while the top electrodes are distributed over a larger area at greater intervals in two horizontal directions. In this construction, the geometric arrangement of any two test points selected on a fine-pitch conductor pattern of a printed wiring board is enlarged at the top electrodes and electrical connections from the test points to external test equipment can be easily established.

10 Claims, 11 Drawing Sheets

ELECTRODE SPACING CONVERSION ADAPTOR

BACKGROUND OF THE INVENTION

1. Field of the Invention

This invention relates to an electrode spacing conversion adaptor to be used to properly connect test points on a fine-pitch conductor pattern of a printed wiring board to external test equipment for automatic board testing.

2. Discussion of the Related Art

For automatic testing of a conductor side of a printed wiring board, it has conventionally been required to connect one or more pairs of test points on the conductor side to an external board tester by using a pair of contact probes.

Each contact probe includes a sleeve and a contact pin which is slidably housed in the sleeve and forced toward a far end of the sleeve by a spring fitted in the sleeve. A lead connected to the contact pin emerges from inside the sleeve for external connection. A pair of such spring contact probes directed to the conductor side of the printed wiring board are moved to desired test points and brought into contact therewith, and connections between the test points and the external board tester are established.

With printed circuit conductor patterns becoming more and more finely pitched nowadays, a problem often encountered with contact probe technique of the prior art has been that the contact pins of two probes tend to contact each other when probing nearby test points, making it impossible to properly perform the board testing.

SUMMARY OF THE INVENTION

In view of the aforementioned problem of the prior art, it is an object of the invention to provide an electrode spacing conversion adaptor which facilitates automatic testing of a printed wiring board carrying a fine-pitch conductor pattern. It is a more specific object of the invention to provide an electrode spacing conversion adaptor which is formed by laminating a plurality of angled sheet elements and carries electrodes arranged with different spacings on top and bottom surfaces of the adaptor so that electrical connections can be easily established from nearby test points on a fine-pitch conductor pattern of a printed wiring board to external test equipment.

According to a main feature of the invention, an electrode spacing conversion adaptor is formed of a plurality of sheet elements having top and bottom electrodes arrayed at different intervals along upper and lower ends of each sheet element, respectively, wherein the top electrodes are individually connected to their corresponding bottom electrodes by conductors, and the individual sheet elements are angled in such a way that the upper portions carrying the top electrodes are stacked in the direction of the thickness of the sheet elements at intervals different from intervals at which the lower portions carrying the bottom electrodes are stacked.

Since the top and bottom electrodes are arrayed at different intervals and the sheet elements are angled such that the upper portions carrying the top electrodes and the lower portions carrying the bottom electrodes can be stacked at different intervals in the direction of their thickness in this construction, the top electrodes are arranged at intervals different from the intervals at which the bottom electrodes are arranged in two horizontal directions when the sheet elements are stacked to form a single structure. More specifically, the sheet elements can be stacked in such a way that the bottom electrodes are arrayed at small intervals and the top electrodes are arranged at large intervals, for example. When the bottom electrodes of the electrode spacing conversion adaptor of this example are positioned in close contact with a conductor pattern of a printed wiring board, test points on the conductor pattern electrically connected to the corresponding top electrodes. Even when individual conductors of the conductor pattern are finely pitched, the geometric arrangement of the test points is enlarged at the top electrodes. This electrode spacing conversion feature of the adaptor makes it easier to connect the printed wiring board to external measuring equipment or to matrix circuit devices for electrical testing between specified test points.

In one aspect of the invention, the thickness of the upper portion of each sheet element carrying the top electrodes may be made different from the thickness of the lower portion of each sheet element carrying the bottom electrodes.

If the upper portion of each sheet element is formed to a thickness larger than that of the lower portion, for example, the top electrodes can be arranged at larger intervals than the bottom electrodes in the stacking direction of the individual sheet elements, without using any specially made spacers.

According to the invention, the electrode spacing conversion adaptor may be produced by laminating the sheet elements into a single laminated piece, or by laminating the sheet elements into a plurality of laminated pieces and further laminating the laminated pieces together with spacers to form a plurality of laminar blocks which can be assembled into a single structure.

The electrode spacing conversion feature can be achieved with each laminated piece regardless of whether it is produced by laminating the sheet elements alone or by laminating the sheet elements together with the spacers to obtain convenient shapes. If a plurality of laminar blocks produced by laminating a plurality of laminated pieces together with the spacers are assembled to form a large-sized boxlike shape, for example, it is possible gather the bottom electrodes arranged at small intervals in a central area of a bottom surface of the electrode spacing conversion adaptor and distribute the top electrodes arranged at large intervals in a broader top surface area of the electrode spacing conversion adaptor.

In another aspect of the invention, the electrodes arrayed at greater intervals may be clustered to form a specified number of electrode groups.

In this construction, the electrodes distributed in the individual electrode groups can be arrayed such that the electrode groups correspond to the individual matrix circuit devices without providing an additional fixture between the electrode spacing conversion adaptor and the matrix circuit devices.

In a further aspect of the invention, an insulating sheet may placed on one side of each sheet element to cover one side of the conductors which are exposed on both sides of each sheet element. The conductors and the remaining part of each sheet element may be made of an electrically conductive rubber material and an electrically nonconductive rubber material, respectively.

In this construction, conductors exposed on one side of the each successive sheet element can be insulated and, therefore, it is not necessary to apply a dielectric coating on each sheet element before laminating the sheet elements.

These and other objects, features and advantages of the invention will become more apparent upon reading the following detailed description in conjunction with the accompanying drawings.

BRIEF DESCRIPTION OF THE DRAWINGS

FIGS. 9A–9C are also explanatory diagrams showing the method of producing the sheet element of FIG. 2, in which FIGS. 9A and 9B are enlarged fragmentary cross-sectional diagrams taken along lines X—X of FIG. 8;

DETAILED DESCRIPTION OF THE PREFERRED EMBODIMENTS

Specific embodiments of the invention are now described, by way of example, with reference to the accompanying drawings.

Figure 2:
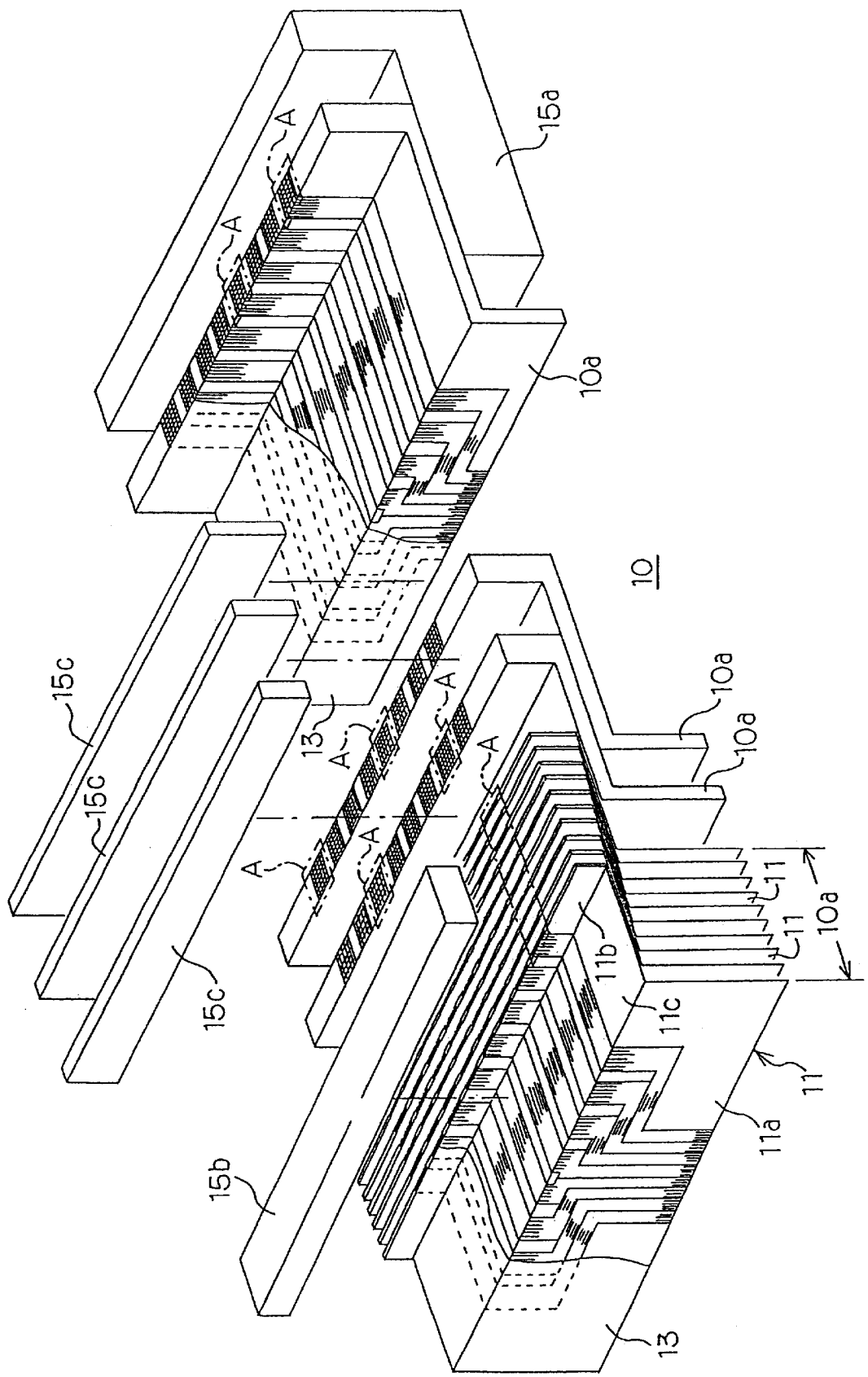
FIG. 2 is an enlarged exploded perspective diagram showing the construction of a laminar block.

Each of the laminar blocks 10 includes a plurality of laminated pieces 10a and spacers 15a, 15b, 15c which are assembled into a shape suited for assembly with the laminar blocks 20 to form the single structure. As shown in FIG. 2, each laminated piece 10a is made by laminating a plurality of sheet elements 11, each of which is formed into a steplike angled shape suited for lamination.

Figure 3:
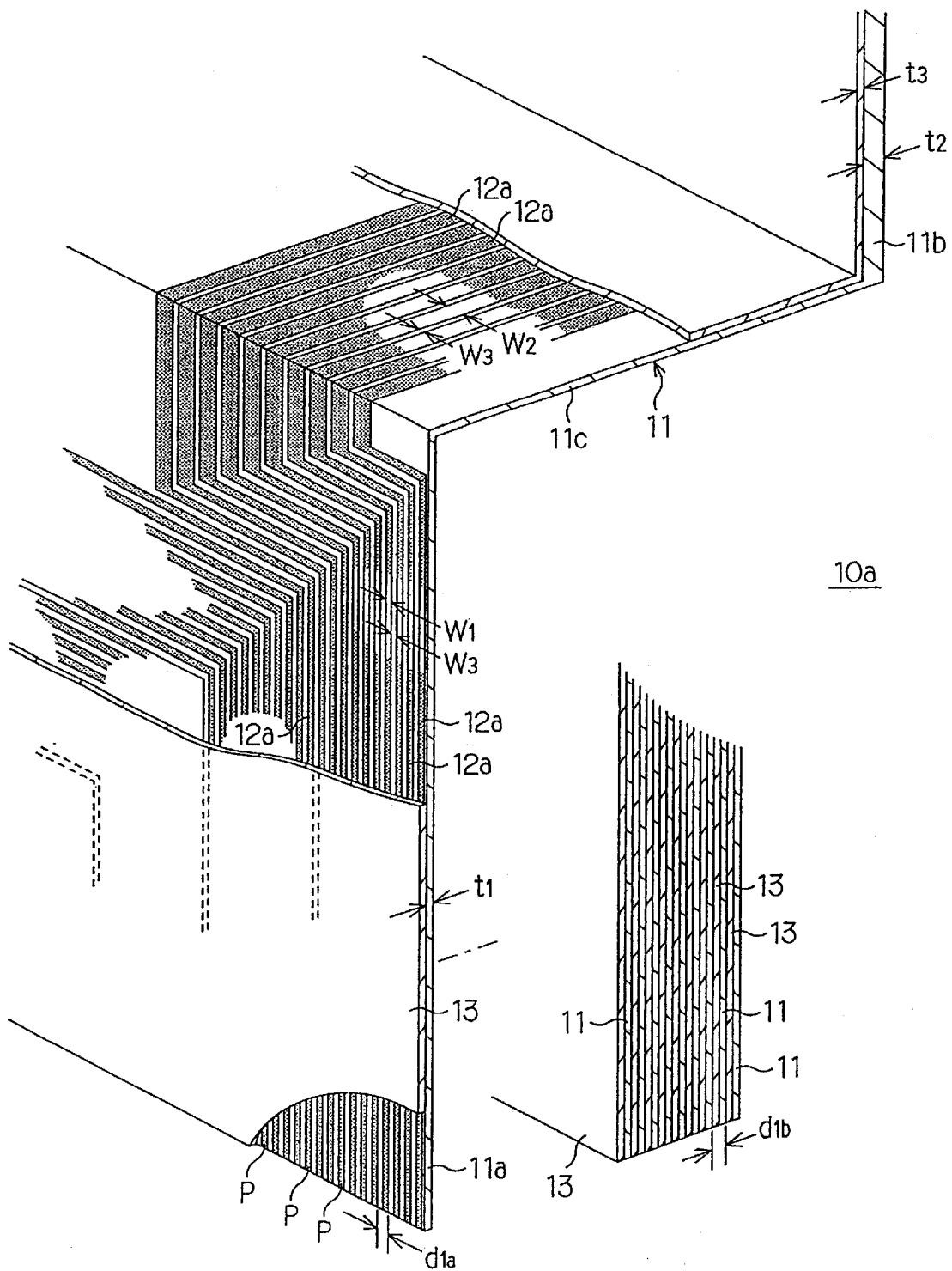
FIG. 3 is an enlarged fragmentary perspective view of a laminated piece shown in FIG. 2.
Figure 4:
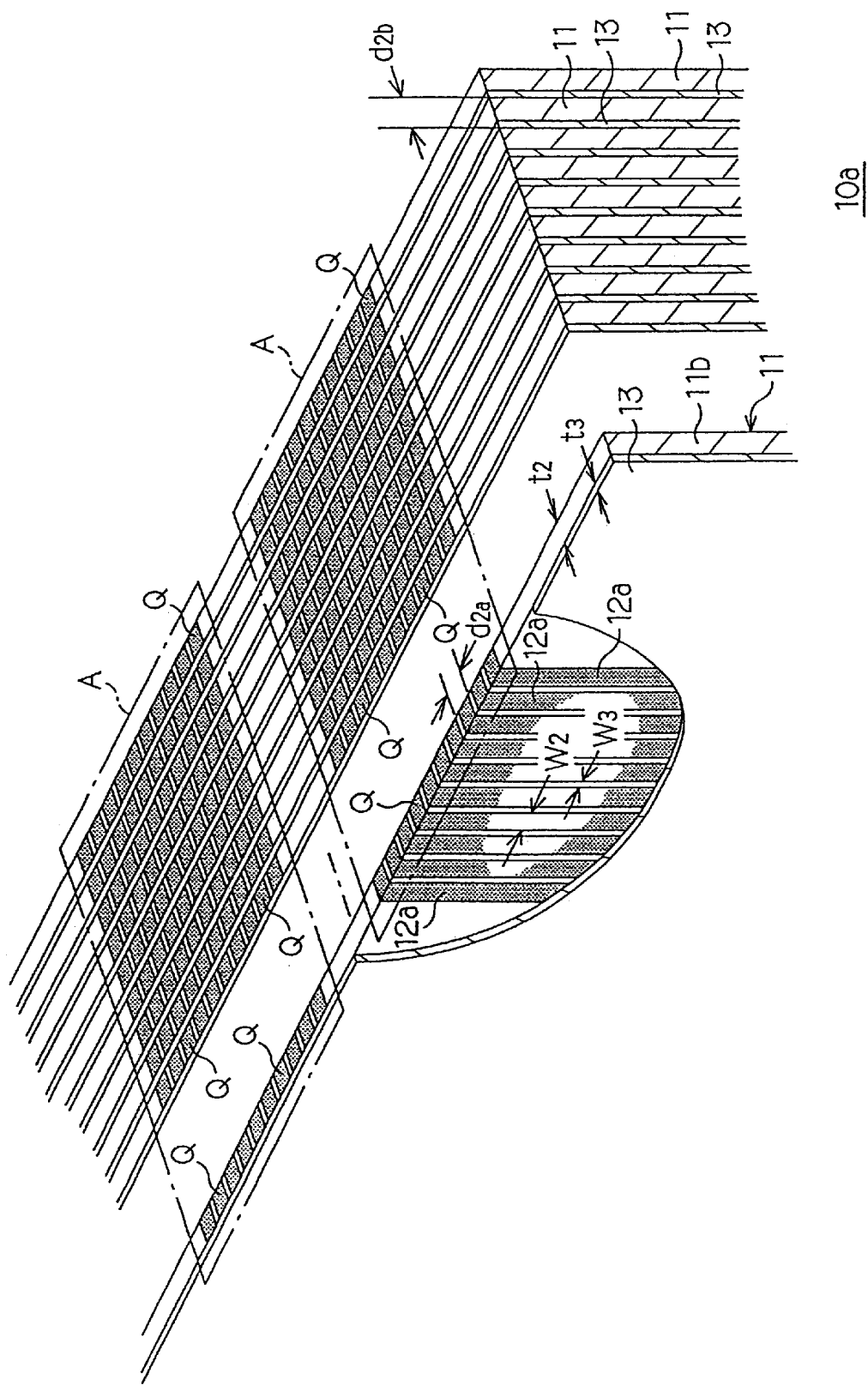
FIG. 4 is also an enlarged fragmentary perspective view of the laminated piece of FIG. 2.

Referring to FIGS. 3 and 4, each sheet element 11 has top and bottom electrodes P, Q and parallel conductors 12a, and insulating sheets 13 are placed between the successive sheet elements 11. Each sheet element 11 includes a lower vertical portion 11a carrying the bottom electrodes P, an upper vertical portion 11b carrying the top electrodes Q, and a horizontal portion 11c connecting the lower vertical portion 11a and the upper vertical portion 11b, the bottom electrodes P being electrically connected to their corresponding top electrodes Q via the individual conductors 12a. The conductors 12a including the electrodes P, Q are made of an electrically conductive rubber material and the remaining part of each sheet element 11 is made of an electrically nonconductive rubber material.

The lower vertical portion 11a and the horizontal portion 11c of each sheet element 11 have a thickness t1 and the upper vertical portion 11b has a thickness t2 which is larger than the thickness t1 (t2>t1). The conductors 12a including the bottom electrodes P have a width W1 and are arranged with a conductor-to-conductor spacing W3 in the lower vertical portion 11a of each sheet element 11, while the conductors 12a including the top electrodes Q have a width W2 and are arranged with the same conductor-to-conductor spacing W3 in the horizontal portion 11c and the upper vertical portion 11b of each sheet element 11, wherein the width W2 is made larger than the width W1 (W2>W1). From this, it is understood that the bottom electrodes P are arranged at intervals of d1a=W1+W3 and the top electrodes Q are arranged at intervals of d2a=W2+W3, where d2a>d1a. In this construction, the top electrodes Q are clustered to form a specified number of electrode groups A as illustrated in FIG. 4. Each insulating sheet 13 has a thickness t3 and covers one side of the individual conductors 12a which are exposed on both sides of each successive sheet element 11.

Each laminated piece 10a is formed by laminating the sheet elements 11 in such a way that their lower vertical portions 11a are stacked at intervals of d1b=t1+t3 and their upper vertical portions 11b are stacked at intervals of d2b=t2+t3, where d2b>d1b. In each laminated piece 10a thus constructed, the bottom electrodes P are arranged at intervals of d1a and d1b in two horizontal directions which are perpendicular to each other, while the top electrodes Q are arranged at intervals of d2a(>d1a) and d2b(>d1b) in the two horizontal directions to form the multiple electrode groups A as stated above.

Figure 1:
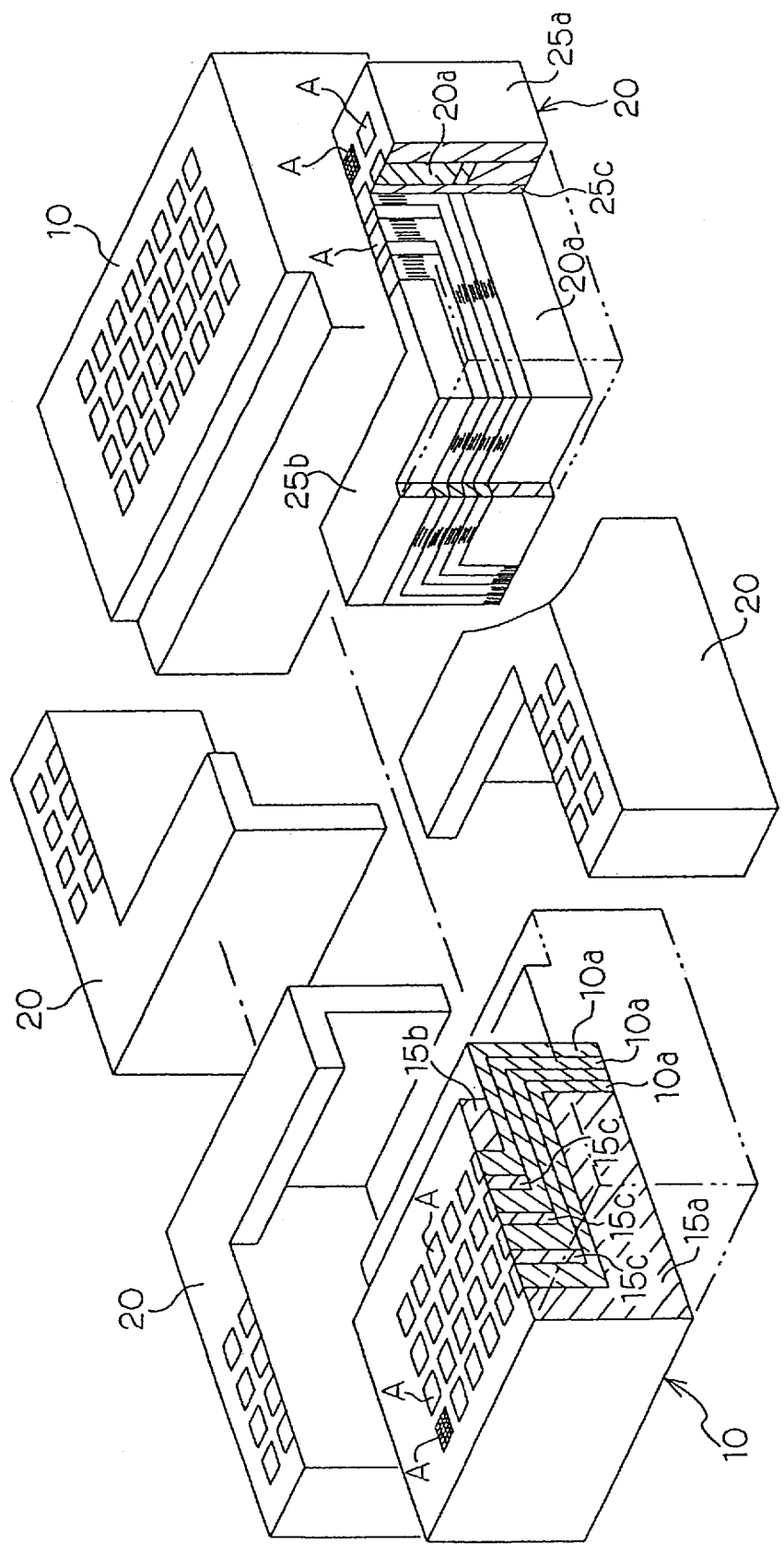
FIG. 1 is a exploded perspective diagram showing the general construction of an electrode spacing conversion adaptor according to an embodiment of the invention.

The laminated pieces 10a are stacked with the spacers 15c placed between the successive upper vertical portions 11b which carry the top electrodes Q, and each laminar block 10 is completed by attaching the spacers 15a and 15b on the outside and the inside, respectively, as shown in FIGS. 1 and 2. In each laminar block 10, the groups A of the top electrodes Q are arranged in a crosshatch configuration as depicted in FIGS. 2 and 4.

Figure 5:
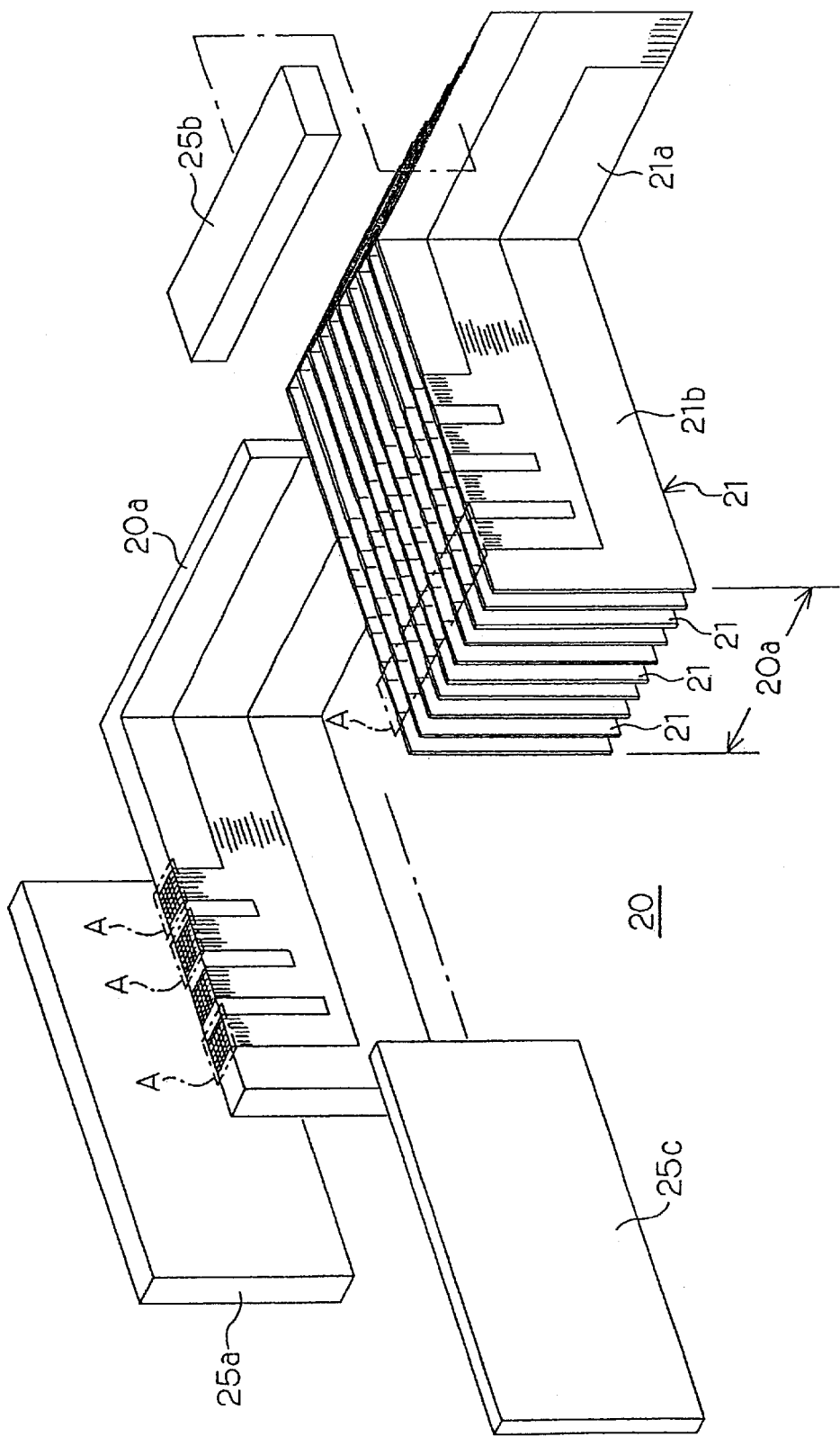
FIG. 5 is an enlarged exploded perspective diagram showing the construction of another laminar block.
Figure 6:
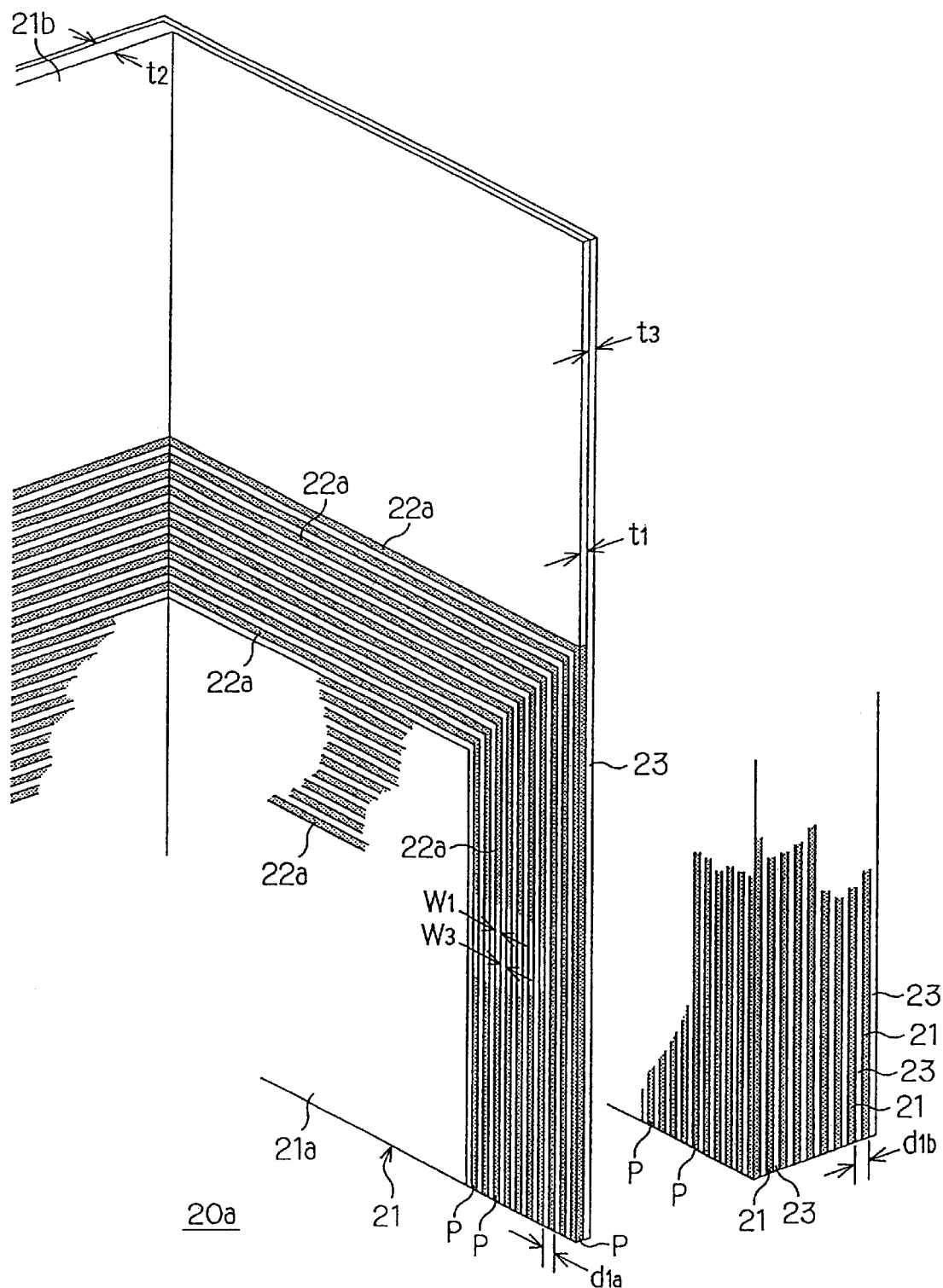
FIG. 6 is an enlarged fragmentary perspective view of a laminated piece shown in FIG. 5.
Figure 7:
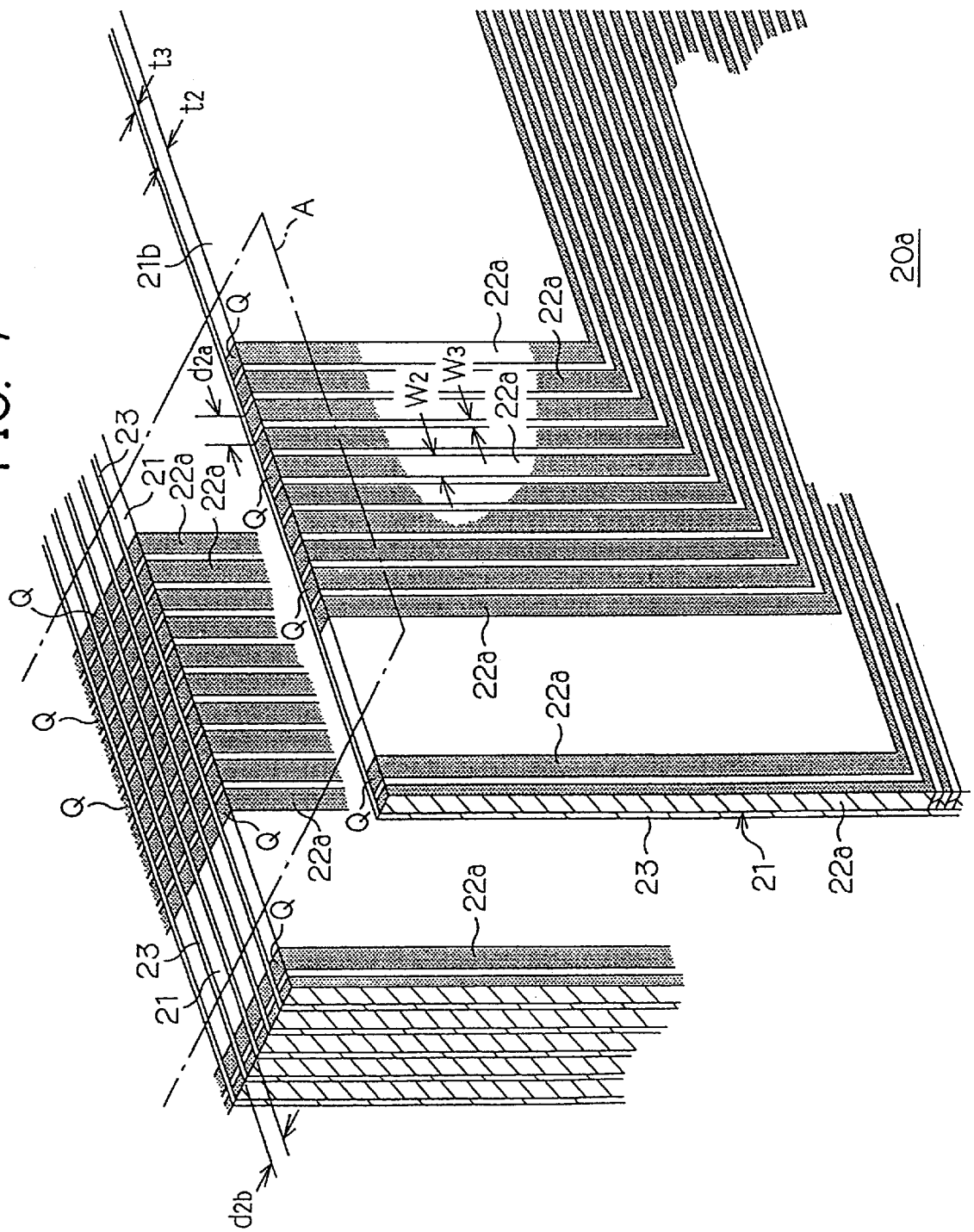
FIG. 7 is also an enlarged fragmentary perspective view of the laminated piece of FIG. 5.

Referring now to FIGS. 1 and 5, each of the laminar blocks 20 includes a plurality of laminated pieces 20a and spacers 25a, 25b, 25c which are assembled into a single structure. As shown in FIGS. 5–7, each laminated piece 20a is made by laminating a plurality of sheet elements 21, each of which is formed into an L-shape in top view that is suited for lamination. Each sheet element 21 includes a first vertical portion 21a carrying bottom electrodes P which have the same thickness t1 as the lower vertical portion 11a of the sheet element 11 and a second vertical portion 21b carrying top electrodes Q which have the same thickness t2 as the upper vertical portion 11b of the sheet element 11, where (t2>t1). The sheet elements 21 are made of the same materials as the sheet elements 11, and the bottom electrodes P are connected to their corresponding top electrodes Q via the individual conductors 22a.

Like the conductors 12a of the sheet elements 11, the conductors 22a including the bottom electrodes P have the width W1 and are arranged with the conductor-to-conductor spacing W3 in the first vertical portion 21a of each sheet element 21, while the conductors 22a including the top electrodes Q have the width W2 and are arranged with the conductor-to-conductor spacing W3 in the second vertical portion 21b of each sheet element 21, where W2>W1. From this, it is understood that the bottom electrodes P are arranged at intervals of d1a=W1+W3 and the top electrodes Q are arranged at intervals of d2a=W2+W3, where d2a>d1a. In this construction, the top electrodes Q are clustered to form a specified number of electrode groups A as illustrated in FIG. 7. An insulating sheet 23 having the thickness t3 is placed on one side of each successive sheet element 21.

Each laminated piece 20a is formed by laminating the sheet elements 21 in such a way that their first vertical portions 21a are stacked at intervals of d1b=t1+t3 and their second vertical portions 21b are stacked at intervals of d2b=t2+t3, where d2b>d1b. In each laminated piece 20a, the bottom electrodes P are arranged at intervals of d1a and d1b in two horizontal directions which are perpendicular to each other, while the top electrodes Q are arranged at intervals of d2a(>d1a) and d2b(>d1b) in the two horizontal directions to form the multiple electrode groups A as stated above.

The laminated pieces 20a are stacked with the spacers 25c placed between the successive second vertical portions 21b which carry the top electrodes Q, and each laminar block 10 is completed by attaching the spacers 25a and 25b on the outside and the inside, respectively, as shown in FIGS. 1 and 5. In each laminar block 20, the groups A of the top electrodes Q are arranged in a crosshatch configuration as depicted in FIGS. 5 and 7.

Figure 8:
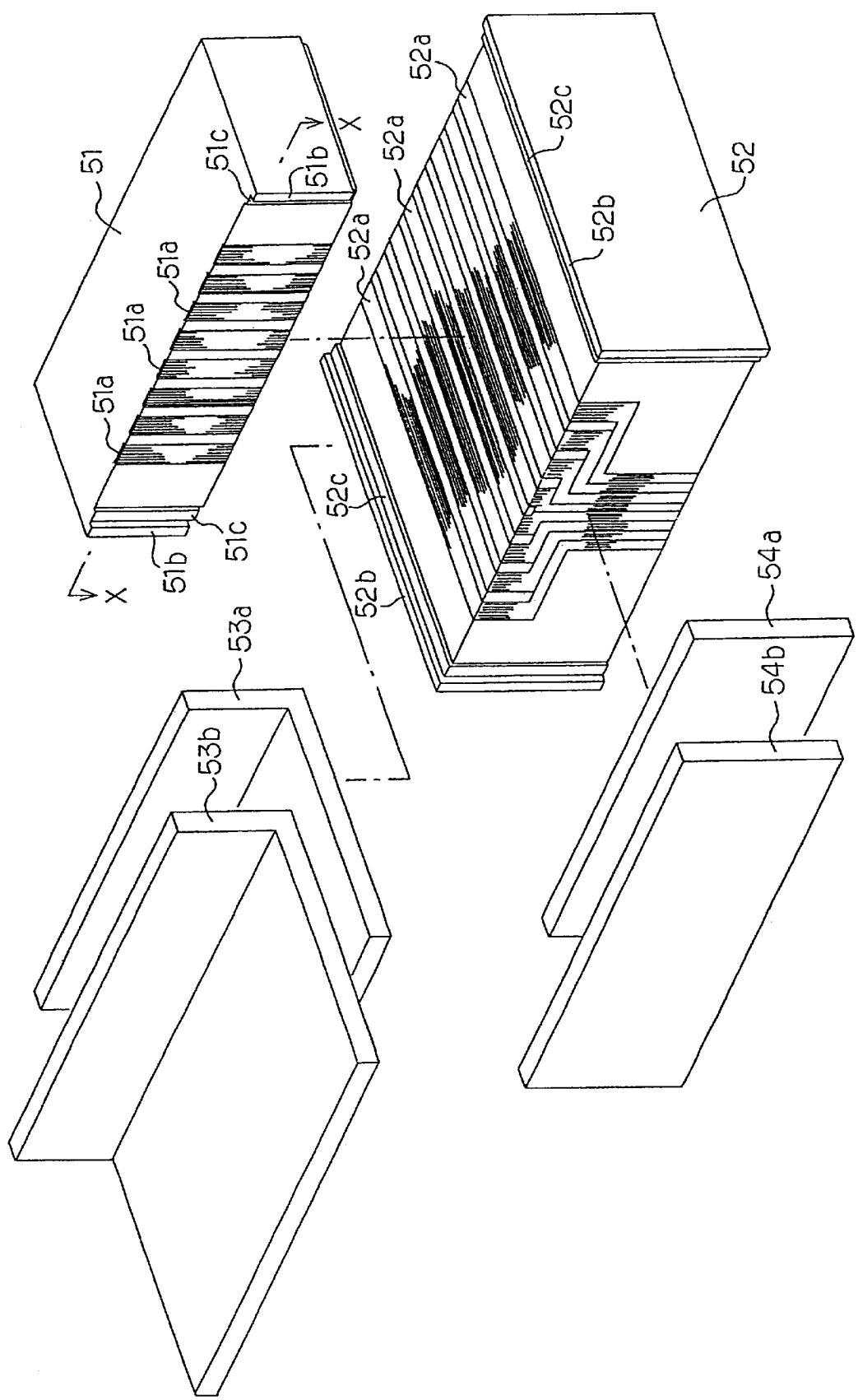
FIG. 8 is an explanatory diagram showing a method of producing a sheet element shown in FIG. 2.
Figure 9A:
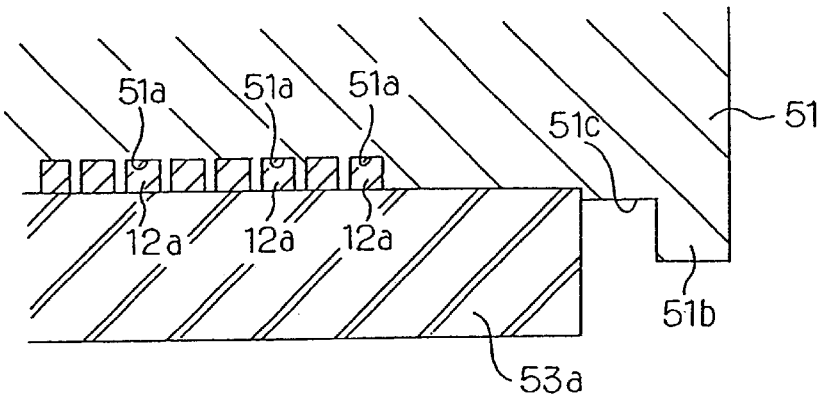
Figure 9B:
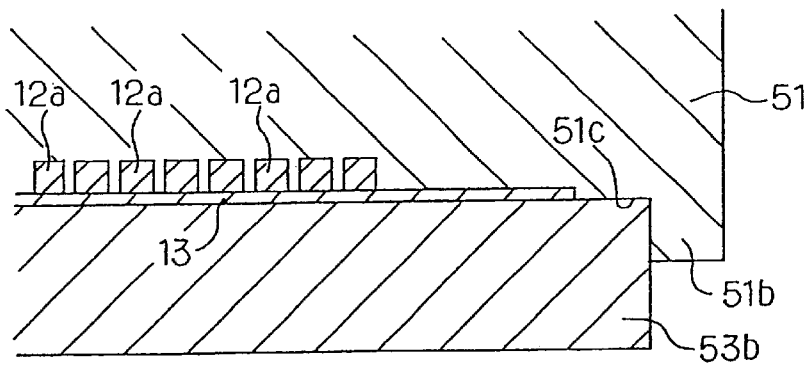
Figure 9C:
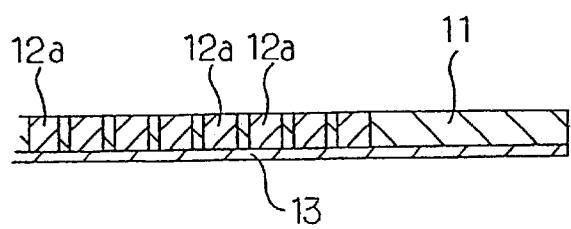

The individual sheet elements 11 are produced by using mold blocks 51, 52 and mold plates 53a, 53b, 54a, 54b which are illustrated in FIGS. 8 and 9A–9C, in which FIGS. 9A and 9B are enlarged fragmentary cross-sectional diagrams taken along lines X—X of FIG. 8.

Referring to FIG. 8, an array of grooves 51a corresponding to the conductors 12a in the upper vertical portion 11b of each sheet element 11 are formed in a front surface of the mold block 51. There are formed steplike raised stages 51b, 51c which are used for positioning on both sides of the array of the grooves 51a. On the other hand, an array of grooves 52a corresponding to the conductors 12a in the horizontal portion 11c and the lower vertical portion 11a of each sheet element 11 are formed in top and front surfaces of the mold block 52, respectively, and raised stages 52b, 52c to be used for positioning are formed on both sides of the array of the grooves 52a. When placed on the top surface of the mold block 52, the mold block 51 can be moved forward or backward for exact propositioning. The mold plate 53a is shaped to fit properly between the raised stages 51c on the front surface of the mold block 51 and between the raised stages 52c on the top surface of the mold block 52, whereas the mold plate 54a is shaped to fit properly between the raised stages 53c on the front surface of the mold block 52. Similarly, the mold plate 53b is shaped to fit properly between the raised stages 51b on the front surface of the mold block 51 and between the raised stages 52b on the top surface of the mold block 52, whereas the mold plate 54b is shaped to fit properly between the raised stages 52b on the front surface of the mold block 52.

The sheet elements 11 are produced by the following procedure. First, the mold block 51 is set at a specified position on the mold block 52 and the mold plates 53a, 54a are fitted to the mold blocks 51, 52. The electrically conductive rubber material is poured in a molten form into empty spaces between the mold blocks 51, 52 and the mold plates 53a, 54a to form the conductors 12a as shown in FIG. 9A. Next, the mold plates 53a, 54a are replaced with the mold plates 53b, 54b and the electrically nonconductive rubber material is poured in a molten form into an empty space between the mold blocks 51, 52 and the mold plates 53b, 54b to form the insulating sheet 13 as shown in FIG. 9B. Subsequently, an intermediate product including the insulating sheet 13 and the conductors 12a is placed in unillustrated male and female molds and the electrically nonconductive rubber material is poured in a molten form into empty spaces between the male and female molds to complete a sheet element 11 shown in FIG. 9C. Since the mold block 51 can be moved forward or backward along the top surface of the mold block 52, it is possible to form the horizontal portion 11c of the sheet element 11 to a desired length. The sheet elements 21 can be produced using the same technique as described above with reference to the sheet elements 11.

Figure 10A:
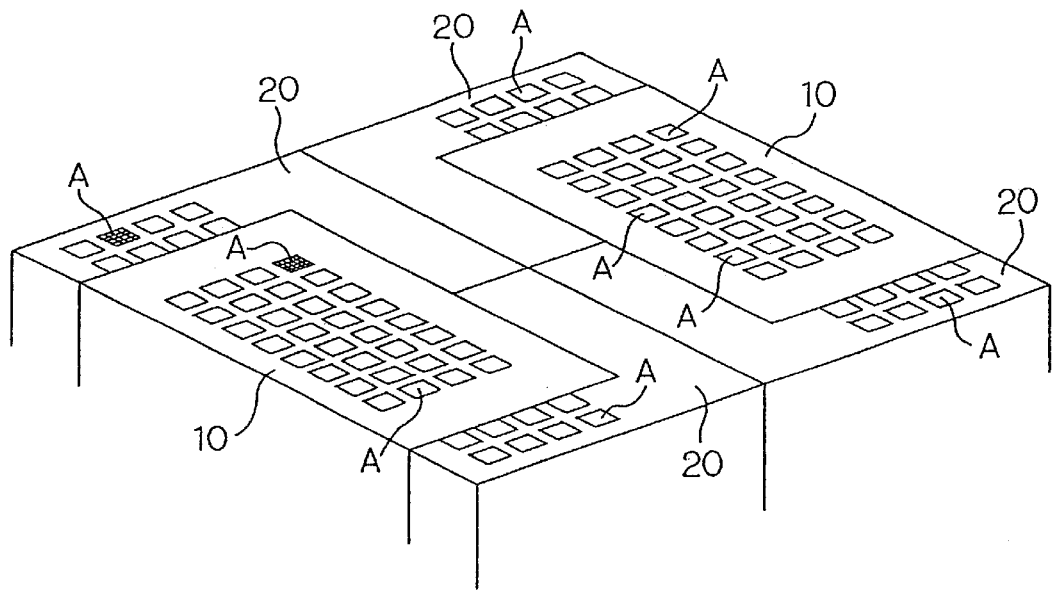
FIGS. 10A–10B are schematic views of the electrode spacing conversion adaptor of the embodiment.
Figure 10B:
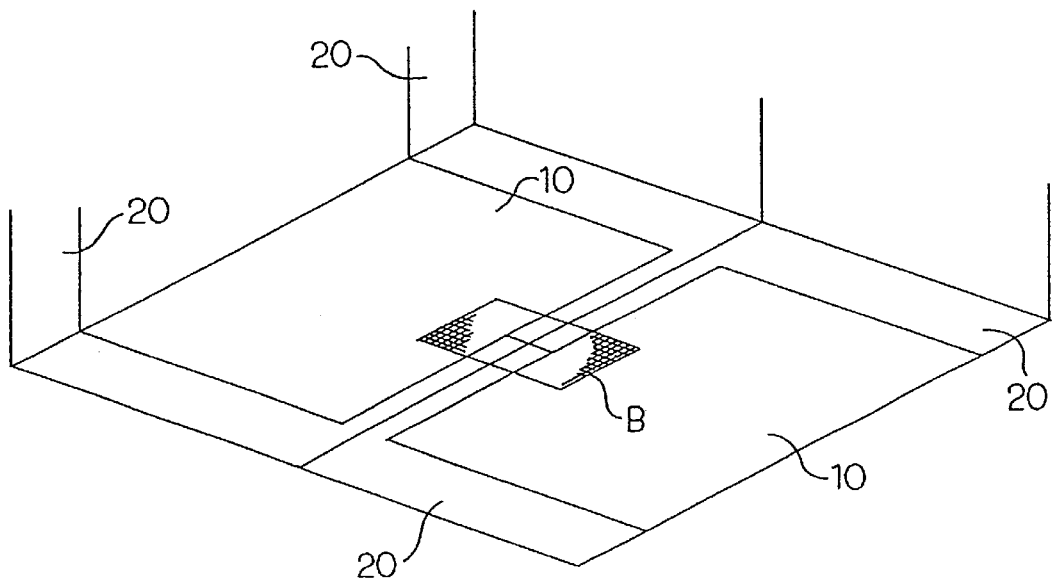

As already stated, the laminar blocks 10, 20 produced in the aforementioned fashion are joined together to form the electrode spacing conversion adaptor shown in FIGS. 1 and 10A–10B. In the electrode spacing conversion adaptor thus constructed, all of the bottom electrodes P are gathered in a central area B of a bottom surface of the electrode spacing conversion adaptor as shown in FIG. 10B, while the top electrodes Q are divided into the multiple electrode groups A as shown in FIG. 10A.

Figure 11:
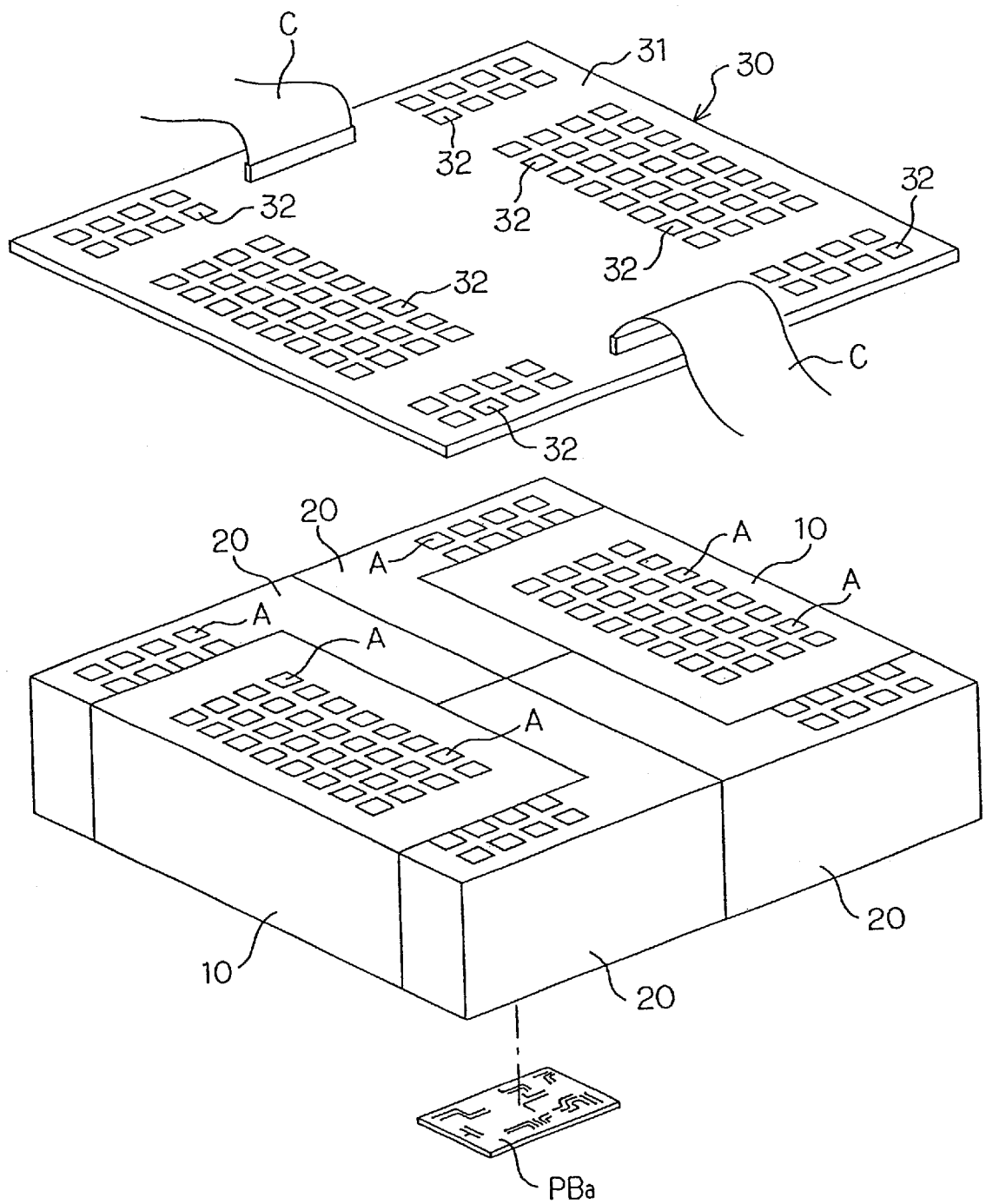
FIG. 11 is a diagram showing how the electrode spacing conversion adaptor of the embodiment is used for testing a printed wiring board.

Referring now to FIG. 11, the electrode spacing conversion adaptor of the embodiment is used for automatic testing of a printed wiring board Pba in combination with a test unit 30.

The test unit 30 includes a baseboard (substrate) 31 on which a plurality of matrix circuit devices 32 are arranged to the match the individual top electrodes Q of the electrode spacing conversion adaptor. Unillustrated contact terminals are formed on the bottom of the individual matrix circuit devices 32 to make electrical connections between the matrix circuit devices 32 and the corresponding top electrodes Q in the relevant electrode groups A of the electrode spacing conversion adaptor. To exchange input and output signals, the matrix circuit devices 32 are connected to an unillustrated external control circuit via flexible flat cables C which are attached to the baseboard 31.

The contact terminals of the individual matrix circuit devices 32 can be automatically connected to all the corresponding top electrodes Q of the electrode spacing conversion adaptor by placing the test unit 30 in close contact with a top surface of the electrode spacing conversion adaptor. With this arrangement, signals from a pair of top electrodes Q to which a pair of contact terminals that belong to one or two matrix circuit devices 32 are connected can be selectively led to the external control circuit based on address signals fed from the external control circuit via the flat cables C. All the bottom electrodes P in the central area B of the bottom surface of the electrode spacing conversion adaptor can be connected to test points on a conductor side of the printed wiring board Pba by placing the electrode spacing conversion adaptor on the printed wiring board Pba so that the printed wiring board Pba comes into close contact with the central area B.

The test unit 30 sequentially selects a pair of top electrodes Q of the electrode spacing conversion adaptor via a pair of contact terminals that belong to one or two matrix circuit devices 32 based on the address signals fed from the external control circuit, and signals from desired two test points on the conductor side of the printed wiring board Pba are led to the external control circuit via the bottom electrodes P corresponding to the selected top electrodes Q. Consequently, the external control circuit can judge whether conductor pattern of the printed wiring board Pba is satisfactory or faulty by measuring the resistance across the selected top electrodes Q. This is because a judgment on compliance or non-compliance to requirements of the conductor pattern of the printed wiring board Pba can be made based on a collection of data on electric conduction between specified pairs of two tests points.

According to the invention, the laminar blocks 10, 20 need not necessarily have the above-described angled shapes but may be formed into simple boxlike shapes. Such boxlike laminar blocks may joined to together form an electrode spacing conversion adaptor or used singly as one-block electrode spacing conversion adaptors. In another variation of the invention, the conductors 12a, 22a may be formed by printing an electrically conductive paint on a surface of each sheet element 11, 21 or by using generally known conductor pattern forming techniques used in producing printed wiring boards. The laminar blocks 10, 20 are not limited in their structure to the illustrated examples but may be formed by combining any desired numbers of laminated pieces 10a, 20a.

What is claimed is:

1. An electrode spacing conversion adaptor comprising:
   a plurality of sheet elements, each sheet element having:
      an upper section, an intermediate section and a lower section, the upper section being connected with the intermediate section at a specified angle, and the intermediate section being connected with the lower section at a specified angle;
      a plurality of top electrodes arrayed along a top end of the upper section at a first interval;
      a plurality of bottom electrodes arrayed along a bottom end of the lower section at a second interval that is different from the first interval; and
      a plurality of conductors for connecting the plurality of top electrodes to the plurality of bottom electrodes, respectively;
   wherein the plurality of sheet elements are stacked so that the upper sections are spaced apart from one another at a first spacing and the lower sections are spaced apart from one another at a second spacing that is different from the first spacing.

2. An electrode spacing conversion adaptor according to claim 1, wherein the thickness of the upper portion of each sheet element carrying the top electrodes is made different from the thickness of the lower portion of each sheet element carrying the bottom electrodes.

3. An electrode spacing conversion adaptor according to claim 1, wherein the sheet elements are laminated to form a single laminated piece.

4. An electrode spacing conversion adaptor according to claim 3, wherein the laminated piece is laminated together with another laminated piece further with a spacer to form a laminar block which can be assembled into a single structure.

5. An electrode spacing conversion adaptor according to claim 1, wherein the electrodes arrayed at greater intervals are clustered to form a specified number of electrode groups.

6. An electrode spacing conversion adaptor according to claim 1, wherein an insulating sheet is placed on one side of each sheet element to cover one side of the conductors which are exposed on both sides of each sheet element.

7. An electrode spacing conversion adaptor according to claim 1, wherein the conductors are made of an electrically conductive rubber material and the remaining part of each sheet element is made of an electrically nonconductive rubber material.

8. An electrode spacing conversion adapter according to claim 1, wherein the conductor extends vertically along the lower vertical section from the bottom electrode and angles in a horizontal direction and angles in a vertical direction again to the top end of the lower vertical section such that a width of the lower vertical portion of the conductor is smaller than that of the upper vertical portion of the conductor.

9. An electrode spacing conversion adapter according to claim 1, wherein each sheet has an L-shape in top view, having a first vertical plane and a second vertical plane which is connected to one side end of the first plane.

10. An electrode spacing conversion adapter comprising:
    a plurality of sheet elements having top and bottom electrodes arrayed at different intervals along upper and lower ends of each sheet element, respectively,
    the top electrodes are individually connected to their corresponding bottom electrodes by conductors, and the individual sheet elements are angled in such a way that the upper portions carrying the top electrodes are stacked in the direction of the thickness of the sheet elements at intervals different from intervals at which the lower portions carrying the bottom electrodes are stacked,
    wherein each of the sheet elements has an L-shape in top view, having a first vertical plane and a second vertical plane which is connected to one side end of the first plane; and
    the top electrodes are carried by the first plane and the bottom electrodes are carried by the second plane.

* * * * *